United States Patent
Korolik et al.

(10) Patent No.: US 12,315,739 B2
(45) Date of Patent: May 27, 2025

(54) ISOTROPIC SILICON NITRIDE REMOVAL

(71) Applicant: Applied Materials, Inc., Santa Clara, CA (US)

(72) Inventors: Mikhail Korolik, San Jose, CA (US); Paul E. Gee, San Jose, CA (US); Wei Ying Doreen Yong, Singapore (SG); Tuck Foong Koh, Singapore (SG); John Sudijono, Singapore (SG); Philip A. Kraus, San Jose, CA (US); Thai Cheng Chua, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 277 days.

(21) Appl. No.: 17/963,687

(22) Filed: Oct. 11, 2022

(65) Prior Publication Data
US 2024/0120210 A1    Apr. 11, 2024

(51) Int. Cl.
*H01L 21/3213*     (2006.01)
*H01L 21/02*       (2006.01)
*H01L 21/3065*     (2006.01)

(52) U.S. Cl.
CPC .. *H01L 21/32136* (2013.01); *H01L 21/02219* (2013.01); *H01L 21/02274* (2013.01); *H01L 21/3065* (2013.01)

(58) Field of Classification Search
None
See application file for complete search history.

(56) References Cited

U.S. PATENT DOCUMENTS

| | | |
|---|---|---|
| 2014/0179111 A1 | 6/2014 | Liu et al. |
| 2019/0206697 A1 | 7/2019 | Eason et al. |
| 2020/0098586 A1 | 3/2020 | Xia et al. |
| 2021/0111033 A1 | 4/2021 | Korolik et al. |
| 2022/0254645 A1 | 8/2022 | Luan et al. |
| 2022/0293430 A1 | 9/2022 | Korolik et al. |

OTHER PUBLICATIONS

Application No. PCT/US2023/075316, International Search Report and Written Opinion, Mailed on Jan. 18, 2024, 10 pages.
Decision to Grant for Taiwan Appln No. 112137859 mailed Sep. 18, 2024, 6 pages.

*Primary Examiner* — Stephanie P Duclair
(74) *Attorney, Agent, or Firm* — Kilpatrick Townsend & Stockton LLP

(57) ABSTRACT

Exemplary methods of etching a silicon-containing material may include flowing a first fluorine-containing precursor into a remote plasma region of a semiconductor processing chamber. The methods may include flowing a sulfur-containing precursor into the remote plasma region of the semiconductor processing chamber. The methods may include forming a plasma within the remote plasma region to generate plasma effluents of the first fluorine-containing precursor and the sulfur-containing precursor. The methods may include flowing the plasma effluents into a processing region of the semiconductor processing chamber. A substrate may be positioned within the processing region. The substrate may include a trench formed through stacked layers including alternating layers of silicon nitride and silicon oxide. The methods may include isotropically etching the layers of silicon nitride while substantially maintaining the silicon oxide.

20 Claims, 5 Drawing Sheets

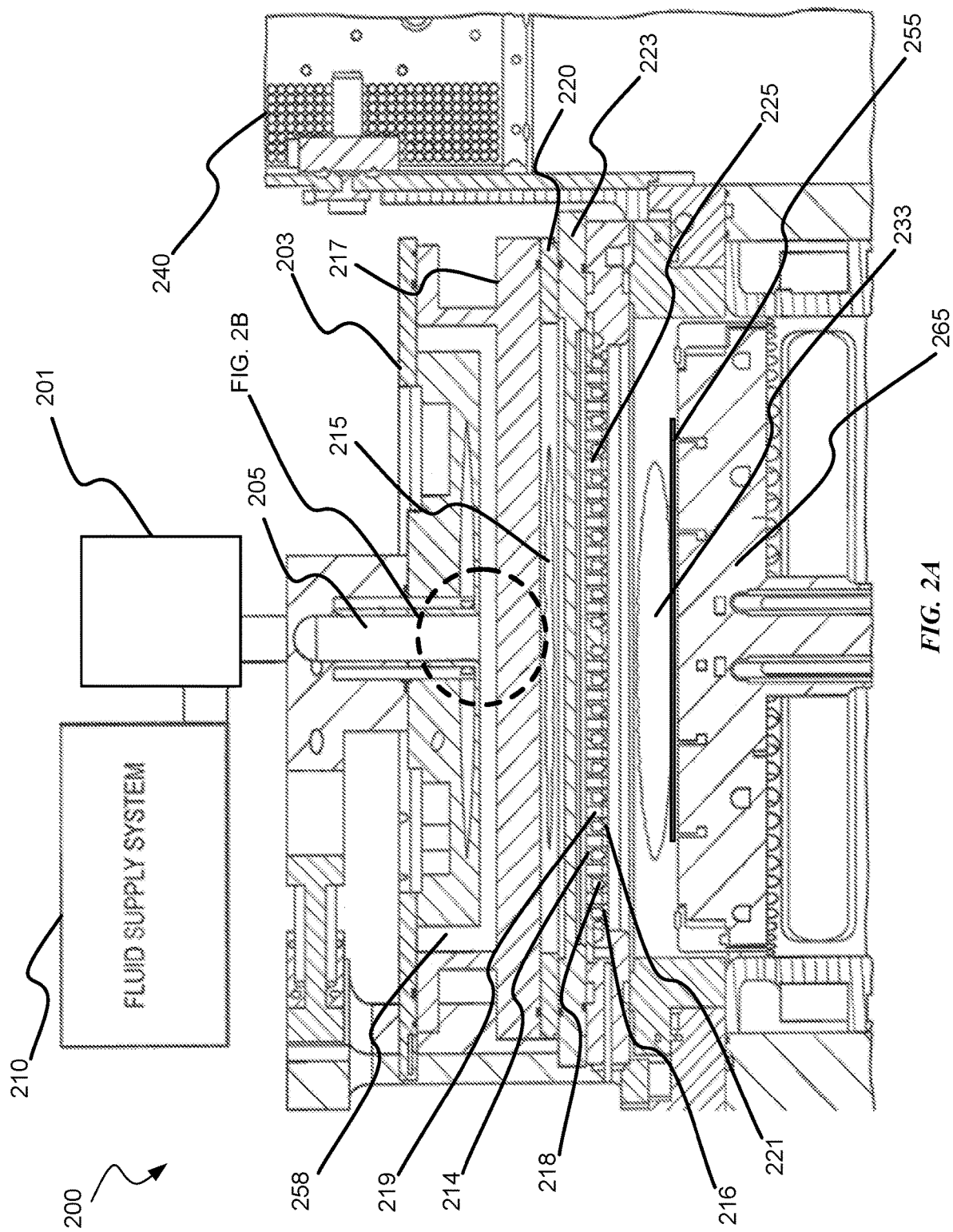

ISOTROPIC SILICON NITRIDE REMOVAL

TECHNICAL FIELD

The present technology relates to semiconductor processes and equipment. More specifically, the present technology relates to isotropically etching materials relative to other materials.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary methods of etching a silicon-containing material may include flowing a first fluorine-containing precursor into a remote plasma region of a semiconductor processing chamber. The methods may include flowing a sulfur-containing precursor into the remote plasma region of the semiconductor processing chamber. The methods may include forming a plasma within the remote plasma region to generate plasma effluents of the first fluorine-containing precursor and the sulfur-containing precursor. The methods may include flowing the plasma effluents into a processing region of the semiconductor processing chamber. A substrate may be positioned within the processing region. The substrate may include a trench formed through stacked layers including alternating layers of silicon nitride and silicon oxide. The methods may include isotropically etching the layers of silicon nitride while substantially maintaining the silicon oxide.

In some embodiments, the methods may include flowing a second fluorine-containing precursor to the processing region of the semiconductor processing chamber. The second fluorine-containing precursor may bypass the remote plasma region. The methods may include halting a flow of the first fluorine-containing precursor and the sulfur-containing precursor after a first period of time. The methods may include purging the processing region with a purge precursor. The sulfur-containing precursor may be or include hydrogen sulfide or carbon disulfide. The methods may include flowing an additive precursor with the first fluorine-containing precursor. The additive precursor may be or include a halogen other than fluorine. An etching selectivity between silicon nitride and silicon oxide may be greater than or about 20:1. The fluorine-containing precursor may include sulfur, phosphorus, arsenic, silicon, carbon, selenium, or tellurium. The method may be performed at a chamber operating pressure of between about 10 mTorr and about 5 Torr. The method may be performed at a chamber temperature of less than or about 20° C. The methods may include flowing argon, helium, or nitrogen with the fluorine-containing precursor. A flow rate ratio of the argon, helium, or nitrogen to the fluorine-containing precursor may be less than or about 2:1. The methods may include flowing a hydrogen-containing precursor with the fluorine-containing precursor. The methods may include forming a passivation layer over the silicon oxide.

Some embodiments of the present technology may encompass methods of etching a silicon-containing material. The methods may include flowing a first halogen-containing precursor into a remote plasma region of a semiconductor processing chamber. The first halogen-containing precursor may include fluorine. The methods may include forming a plasma within the remote plasma region to generate plasma effluents of the first halogen-containing precursor. The methods may include flowing the plasma effluents into a processing region of the semiconductor processing chamber. A substrate may be positioned within the processing region. The substrate may include a trench formed through stacked layers including alternating layers of silicon nitride and silicon oxide. The methods may include flowing a second halogen-containing precursor directly to the processing region of the semiconductor processing chamber. The second halogen-containing precursor comprises fluorine. The methods may include laterally etching the layers of silicon nitride. The methods may include halting a flow of the first halogen-containing precursor after a first period of time. The methods may include purging the processing region with a purge precursor.

In some embodiments, the methods may include flowing a sulfur-containing precursor into the remote plasma region of the semiconductor processing chamber. The second halogen-containing precursor comprises chlorine, bromine, or iodine. The methods may include repeating the method for at least 10 cycles. The first period of time may be greater than or about 30 seconds. The methods may include flowing argon or nitrogen with the first halogen-containing precursor.

Some embodiments of the present technology may encompass methods of etching a silicon-containing material. The methods may include flowing a first fluorine-containing precursor into a remote plasma region of a semiconductor processing chamber. The methods may include flowing a sulfur-containing precursor into the remote plasma region of the semiconductor processing chamber. The methods may include forming a plasma within the remote plasma region to generate plasma effluents of the first fluorine-containing precursor and the sulfur-containing precursor. The methods may include flowing the plasma effluents into a processing region of the semiconductor processing chamber. A substrate may be positioned within the processing region. The substrate may define a trench through stacked layers including alternating layers of silicon nitride and silicon oxide. The methods may include flowing a second fluorine-containing precursor to the processing region of the semiconductor processing chamber. The second fluorine-containing precursor may bypass the remote plasma region. The methods may include isotropically etching the layers of silicon nitride.

Such technology may provide numerous benefits over conventional systems and techniques. For example, the processes may selectively etch silicon nitride isotropically within semiconductor structures. Additionally, the processes may protect exposed oxide during the etch process. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 2A shows a schematic cross-sectional view of an exemplary processing chamber according to some embodiments of the present technology.

Figure 1:
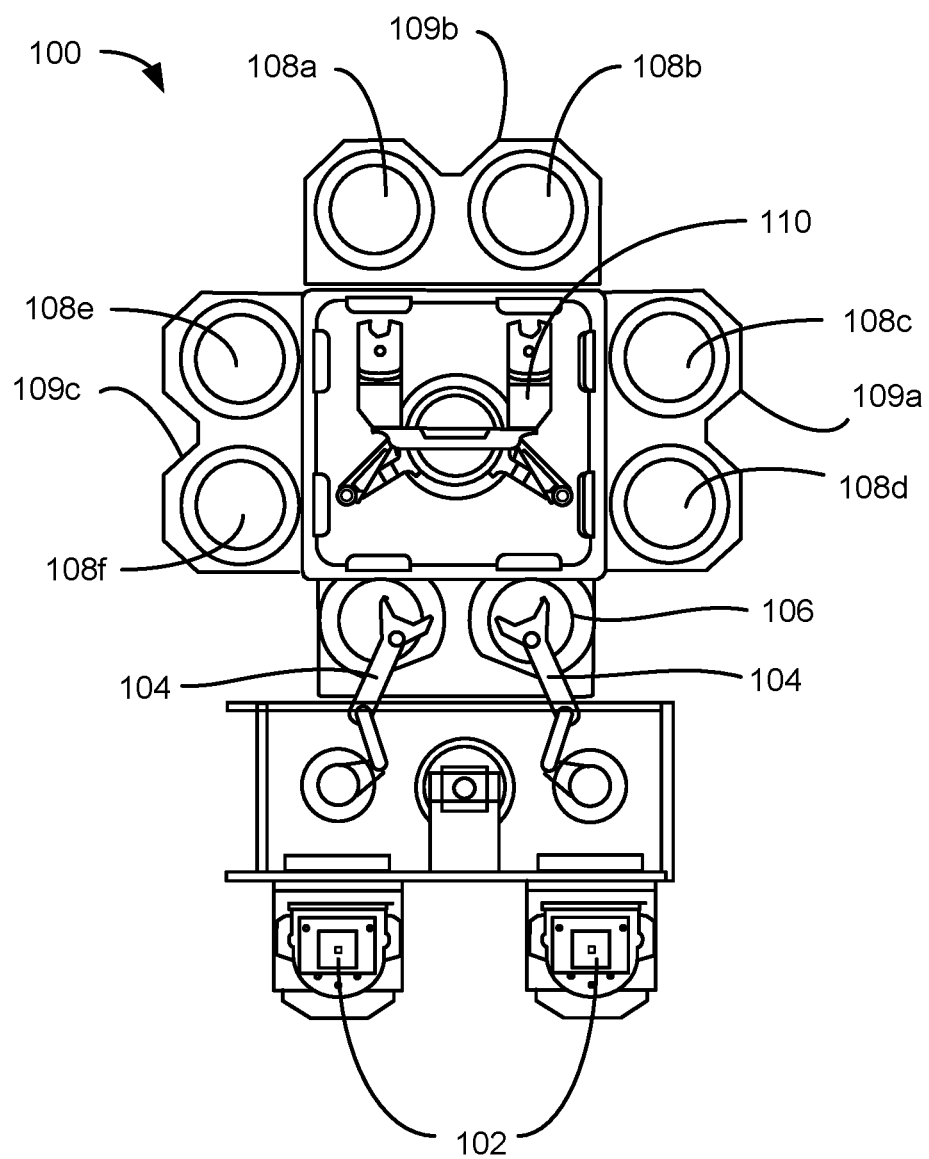
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In transitioning from 2D NAND to 3D NAND, many process operations are modified from vertical to horizontal operations. Additionally, as 3D NAND structures grow in the number of cells being formed, the aspect ratios of memory holes and other structures increase, sometimes dramatically. During 3D NAND processing, stacks of placeholder layers and dielectric materials may form the interelectrode dielectric or IPD layers. These placeholder layers may have a variety of operations performed to place structures before fully removing the material and replacing it with metal. While the metallization may be incorporated on one side of the cell structure, operations may have previously been performed on the other side of the structure, such as forming floating gates or charge-trap layers. Although these layers may be formed within the memory hole, crosstalk between vertically separated memory cells may occur. One way to reduce this communication may include etching the placeholder material before forming these layers to allow dielectric material to further separate the individual cell material layers from adjacent cells.

Many conventional technologies utilize a wet etch to access each of the cell placeholder materials to perform a lateral etch of placeholders before forming layers, such as the charge-trap layer. However, wet etching may be more robust than other etching techniques, and the wet etching may etch the placeholder materials further than necessary or desired. For example, the wet etching may over etch some features. Additionally, wet etching of small form factor structures may cause pattern collapse or deformation due to surface tension of the etchant. Using wet etchants may also create the need for subsequent operations to remove residues formed within the trenches or holes. Dry etching techniques may also be performed, however many of the dry etchants utilized additionally etch silicon and silicon oxide, reducing selectivity of the process.

The present technology overcomes these issues by performing a dry etch process which may selectively etch silicon nitride laterally, while limiting etching of oxide. By utilizing particular precursor combinations, exposed surfaces of the oxide may be protected during the etch process. In this way, the protective material may allow etching operations to be performed that may not remove or may only minimally remove underlying structure materials.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the single-chamber operations described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f* can be outfitted to perform a number of substrate processing operations including the dry etch processes described herein in addition to cyclical layer deposition, atomic layer deposition, chemical vapor deposition, physical vapor deposition, etch, pre-clean, degas, orientation, and other substrate processes.

The substrate processing chambers 108*a-f* may include one or more system components for depositing, annealing, curing and/or etching a dielectric film on the substrate wafer. In one configuration, two pairs of the processing chambers, e.g., 108*c-d* and 108*e-f*, may be used to deposit dielectric material on the substrate, and the third pair of processing chambers, e.g., 108*a*-b, may be used to etch the deposited dielectric. In another configuration, all three pairs of chambers, e.g., 108*a-f*, may be configured to etch a dielectric film on the substrate. Any one or more of the processes described may be carried out in one or more chambers separated from the fabrication system shown in different embodiments. It will be appreciated that additional configurations of deposition, etching, annealing, and curing chambers for dielectric films are contemplated by system 100.

FIG. 2A shows a cross-sectional view of an exemplary process chamber system 200 with partitioned plasma generation regions within the processing chamber, and which may be configured to perform processes as described further below. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system 201 may optionally be included in the system, and may process a first gas which then travels through gas inlet assembly 205. The inlet assembly 205 may include two or more distinct gas supply channels where the second channel may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205. In some embodiments, additional plasma sources may be utilized including inductively-coupled plasma sources extending about the chamber or in fluid communication with the chamber, as well as additional plasma-generating systems, such as microwave plasma-generating systems.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
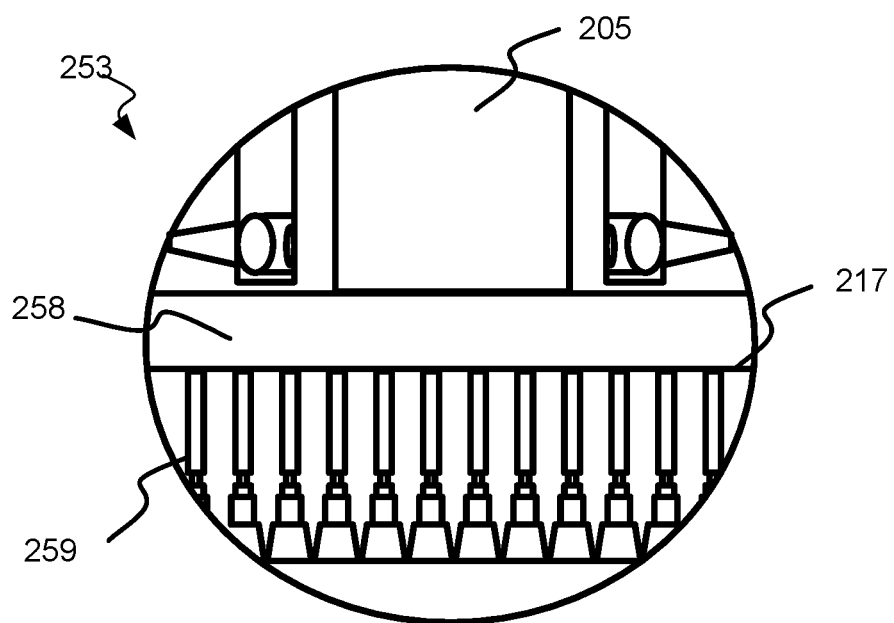
FIG. 2B shows a detailed view of a portion of the processing chamber illustrated in FIG. 2A according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
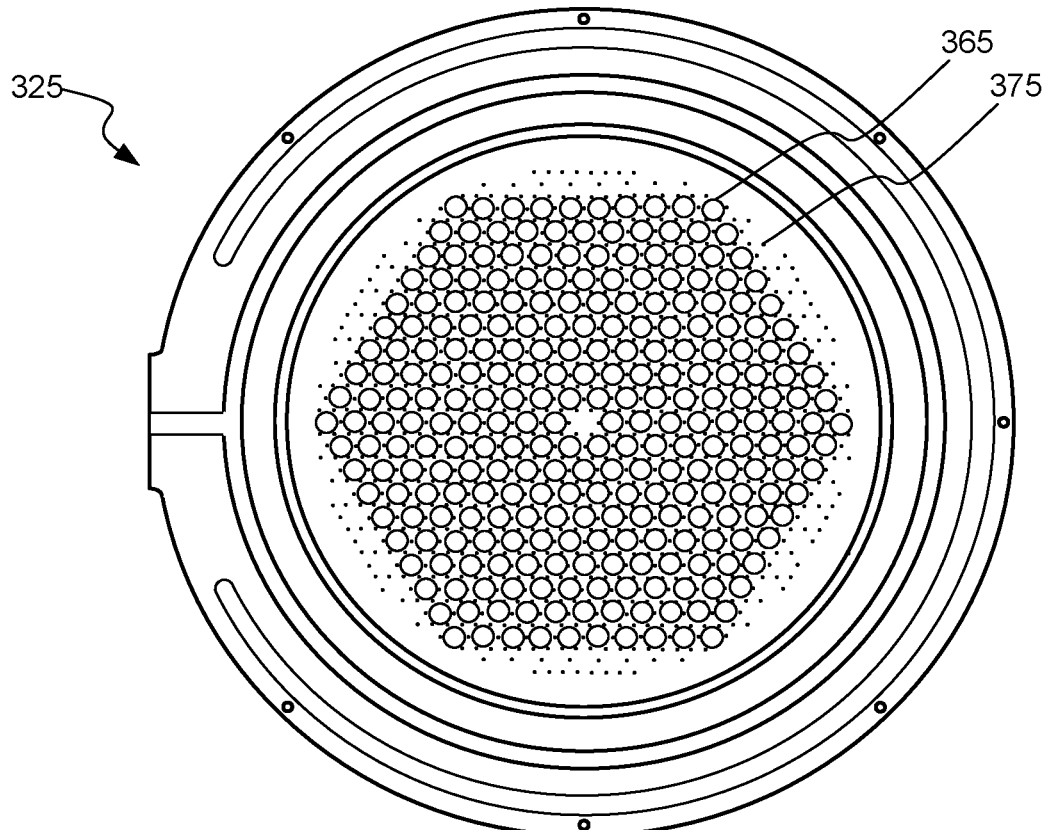
FIG. 3 shows a bottom plan view of an exemplary showerhead according to some embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
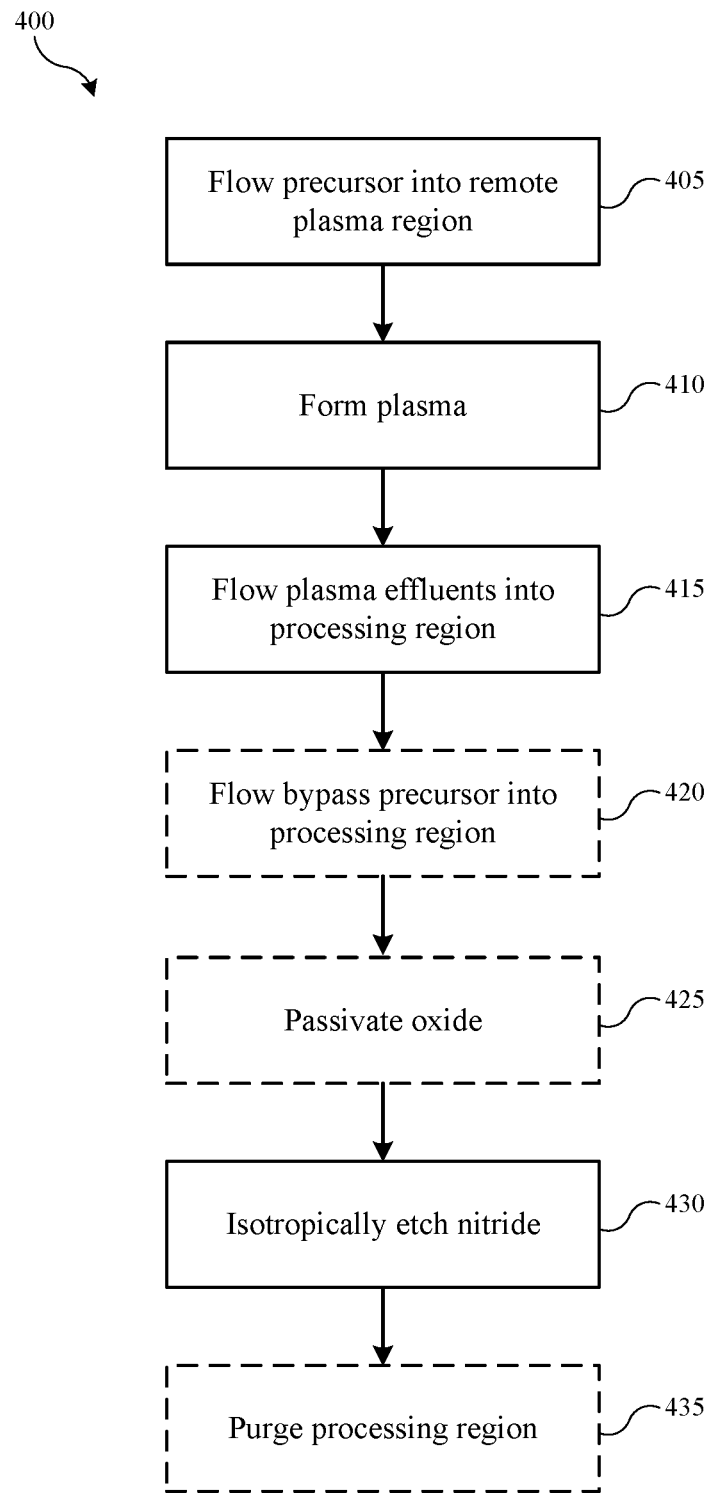
FIG. 4 shows exemplary operations in a method according to some embodiments of the present technology.

The chambers discussed previously may be used in performing exemplary methods including etching methods. Turning to FIG. 4 is shown exemplary operations in a method 400 according to embodiments of the present technology. Prior to the first operation of the method a substrate may be processed in one or more ways before being placed within a processing region of a chamber in which method 400 may be performed. For example, IPD layers may be formed on the substrate and then one or more memory holes or trenches may be formed through the stacked layers. The IPD layers may include any number of materials, and may include alternating layers of a placeholder material and a dielectric material. In embodiments the dielectric material may be or include silicon oxide, and the placeholder material may be or include silicon nitride. Although the remaining disclosure will discuss silicon nitride and silicon oxide, any other known materials used in these two layers may be substituted for one or more of the layers. Some or all of these operations may be performed in chambers or system tools as previously described, or may be performed in different chambers on the same system tool, which may include the chamber in which the operations of method 400 are performed.

The method 400 may include flowing a fluorine-containing precursor into a remote plasma region of a semiconductor processing chamber at operation 405. An exemplary chamber may be chamber 200 previously described, which may include one or both of the RPS unit 201 or first plasma region 215. Either or both of these regions may be the remote plasma region used in operation 405. A plasma may be generated within the remote plasma region at operation 410, which may generate plasma effluents of the fluorine-containing precursor. The plasma effluents may be flowed to a processing region of the chamber at operation 415. In some embodiments, the method 400 may include flowing one or more precursors directly to the processing region, bypassing the remote plasma region, at operation 420. In some embodiments, the plasma effluents may interact with the substrate in the processing region, and may passivate or protect some portions of the structure at optional operation 425. For example, in some embodiments the plasma effluents may passivate the oxide material. As noted, the substrate may include a silicon or silicon-containing substrate or wafer on which a number of layers of material have been formed, such as alternating layers of silicon oxide and silicon nitride. A memory hole or trench may be formed through the stacked layers that extends to the level of the substrate, which may provide an exposed portion of the substrate at the bottom of the hole or trench. In this way, within the memory hole structure, there may be exposed regions of silicon nitride, silicon oxide, and silicon or some silicon-containing material.

The formation of the hole or trench may have occurred in a different chamber, or at some previous operational step. If performed within the same chamber as method 400, the exposed portion of the surface of the substrate may be relatively clean or neat. However, if the process was performed in a different chamber, or in a different environment, there may be a native oxide formed over the exposed portion of the substrate through the hole or trench. The native oxide may be different from the oxide formed in the alternating layers of the memory structure. For example, while the layers of silicon oxide that may be used to divide memory cells may be a relatively higher quality oxide, native oxide may be a relatively low-quality oxide, and may be relatively porous compared to the layers of silicon oxide.

The etching process to remove silicon nitride may have relatively high selectivity to silicon oxide, such as a selectivity greater than or about 100:1 or more. However, in some structures, the amount of silicon nitride to be removed may be several nanometers up to a fraction of a micrometer or more. For example, in some embodiments the amount of silicon nitride to be recessed may be tens of nanometers up to hundreds of nanometers. Such an amount of material to be etched may occur over a relatively longer etching time period. The selectivity to oxide of the nitride removal process may operate in part based on an oxide resistance to the etchant, which may include a number of fluorine-containing materials. Fluorine may eventually permeate portions of the silicon oxide materials as well, creating volatile materials that will remove the silicon oxide material as well. However, this process generally includes an incubation period in which the fluorine slowly interacts with the oxide material. The incubation may occur over 2 minutes or more, such as up to 5 minutes, up to 10 minutes, or more depending on the quality of the oxide, the energy of the fluorine, and other processing conditions. Consequently, by forming a passivation of the silicon oxide, the oxide material may be affected in a limited manner while the process may laterally or isotropically etch silicon nitride at operation 430.

The radical fluorine effluents may contact the semiconductor structure and permeate the formed trench. The exposed surfaces of silicon oxide may not be affected, or may be minimally affected by the fluorine plasma effluents, while the silicon nitride may be etched laterally between sections of the silicon oxide. Additionally, as will be explained below, by utilizing particular fluorine-containing precursors, as well as additive precursors in some embodiments, a passivation layer may be formed over the exposed surfaces of the silicon oxide, and which may form a polymerized protective layer over the material.

The extent of this damage or interaction may be related to the power of the plasma used to form the fluorine-containing plasma effluents, as well as the distance to be travelled by the formed effluents. For example, by utilizing a remote plasma, a relatively lower plasma power may be used, such as below 5 kW, below or about 3 kW, below or about 1 kW, below or about 500 W, or less, which may limit the energy of the plasma effluents, as well as limit the full dissociation of precursor materials. Additionally, by forming a remote plasma, which may include ion filtering prior to delivery to the substrate as explained above, the extent to which the ion plasma effluents interact with the silicon nitride structure may be limited. For example, a local plasma may retain sufficient energy at the wafer level to at least damage upper layers of the silicon oxide or silicon nitride contained in the stack through a bombardment process. Furthermore, the plasma power may be pulsed, which may further lower the effective plasma power. Additionally, ion effluents often have a directionality, which may benefit anisotropic etching for surfaces normal to the direction of effluent delivery, but may not facilitate lateral etching. The present technology utilizes neutral or radical species produced in the plasma to produce an isotropic etchant, which may laterally etch the silicon nitride. As total flow is reduced and/or pressure is increased, as noted below, plasma power may be further reduced, such as below or about 400 W, below or about 300 W, below or about 200 W, below or about 100 W, or less, while plasma is sustained. This may further limit fluorine dissociation and additive precursor dissociation, which may improve both selective etching of nitride, which may occur more readily while oxide etching may occur subsequent an initiation period or saturation. Additionally, additive precursors may have reduced dissociation, which may facilitate development of a passivation layer in some embodiments.

The etching process may be continued for a first period of time in some embodiments. Subsequent the first period of time, a flow of the fluorine-containing precursor may be halted along with formation of the plasma. A purge may then be performed at optional operation 435, which may remove residual etchant materials, etch byproducts, or other materials from the chamber. The purge may be performed with any number of materials that may be chemically inert, such as nitrogen or noble gases, which may be used to purge the processing region of the chamber. The purging process may improve etch selectivity by expediting removal of byproducts as well as less beneficial plasma effluents, and reduce the residence time of these materials within the processing region. This may facilitate the lateral etching of the silicon nitride while reducing exposure and impact on silicon oxide, for example.

The first period of time may be sufficient to produce etching, while limiting residence time that may begin to affect oxide surfaces. For example, in some embodiments the first period of time may be greater than or about 5 seconds, and may be greater than or about 10 seconds, greater than or about 15 seconds, greater than or about 20 seconds, greater than or about 25 seconds, greater than or about 30 seconds, greater than or about 35 seconds, greater than or about 40 seconds, greater than or about 45 seconds, greater than or about 50 seconds, greater than or about 55 seconds, greater than or about 60 seconds, greater than or about 2 minutes, greater than or about 3 minutes, greater than or about 4 minutes, greater than or about 5 minutes, or longer. However, to limit additional effects, in some embodiments the first period of time may be less than or about 5 minutes, less than or about 4 minutes, less than or about 3 minutes, less than or about 2 minutes, or less.

Precursors used in the present technology may include a fluorine-containing precursor as well as additional precursors as will be described below. An exemplary fluorine-containing precursor may be nitrogen trifluoride ($NF_3$), which may be flowed into the remote plasma region, which may be separate from, but fluidly coupled with, the processing region. Other sources of fluorine may be used in conjunction with or as replacements for the nitrogen trifluoride. In general, a fluorine-containing precursor may be flowed into the remote plasma region and the fluorine-containing precursor may include at least one precursor selected from the group of atomic fluorine, diatomic fluorine, nitrogen trifluoride, carbon tetrafluoride, hydrogen fluoride, xenon difluoride, and various other fluorine-containing precursors used or useful in semiconductor processing.

In some embodiments, fluorine-containing precursors may be characterized by enhanced fluorine content in molecules of the fluorine-containing precursor. For example, in some embodiments the fluorine-containing precursor may be characterized by a molecular formula of $XF_y$. X may be any number of materials or periodic elements, and y may be a number greater than or about 1, greater than or about 2, greater than or about 3, greater than or about 4, greater than or about 5, greater than or about 6, or more. In some embodiments the fluorine may be replaced with additional halogen elements. The designation of the formula may be merely for representation of ratios, and may not limit the precursors. For example, $X_2F_8$ may be encompassed by the formula listed, where y would be 8. Additional examples encompassed by the formula would be readily appreciated as well. Element X may be any of a variety of elements that may form compounds with fluorine or other halides.

For example, non-limiting examples may include any other non-metal that may bond with the halide, such as sulfur or phosphorus, as well as any other poor metals, transition metals, or other elements that may chemically bond with halogen elements. As non-limiting examples, fluorine-containing precursors may include phosphorus pentafluoride, sulfur hexafluoride, and other fluorine or halogen-containing materials. These materials may produce a host of plasma effluent materials that may increase etching. For example, with sulfur hexafluoride, a variety of elements including S, SF, $SF_2$, $SF_3$, $SF_4$, $SF_5$, $F_2$, $S_2F_8$, among a number of other radical and neutral species may be produced and facilitate etching.

Although any number of halogen-containing precursors may be used, such as fluorine-containing precursors, some materials, such as phosphorus and sulfur, may improve selectivity over other materials, such as nitrogen trifluoride, for example, because of an additional affect that may be provided with the silicon oxide materials. For example, sulfur compounds and phosphorus compounds may produce a type of passivation or protective material on exposed surfaces of the silicon oxide. For example, sulfur and phosphorus are large enough elements that an amount of polymerization may occur to produce a type of bridge polymer over the surface of the oxide. Sulfur may bond with the oxygen surface, and become incorporated within the film, while maintaining one or more fluorine atoms, which may protect the surface from additional fluorination and reaction with the oxygen surface. This may allow the nitride structures to be etched while maintaining or limiting any effect on the oxide layers, as there may not be a corollary formation on nitride.

In some embodiments, a sulfur-containing precursor may be flowed with the fluorine-containing precursor. An exemplary sulfur-containing precursor may be hydrogen sulfide ($H_2S$), which may be flowed into the remote plasma region with the fluorine-containing precursor. Other sources of sulfur may be used in conjunction with or as replacements for the hydrogen sulfide. In general, a sulfur-containing precursor may be flowed into the remote plasma region and the sulfur-containing precursor may include at least one precursor selected from the group of hydrogen sulfide, carbon disulfide, disulfur dichloride, disulfur tetrachloride, and various other sulfur-containing precursors used or useful in semiconductor processing. As previously discussed, sulfur may improve selectivity over other materials, such as the fluorine-containing precursor, because of a formation of passivation or protective material on exposed surfaces of the silicon oxide materials. Accordingly, flowing a sulfur-containing precursor with the fluorine-containing precursor may balance etch selectivity by increasing the formation of passivation or protective material.

In some embodiments, an additive precursor may be flowed with the fluorine-containing precursor and, if present, the sulfur-containing precursor. The additive precursor may be or include a halogen-containing precursor including a different halogen from fluorine. For example, the additive precursor may include a precursor including a Group VII element, or halogen, with any Group III, Group IV, Group V, or Group VI element, and in any combination. Exemplary materials may be characterized by the formula $X_aY_b$, where X includes any Group III, Group IV, Group V, or Group VI element, Y includes chlorine, bromine, or iodine, a is 1, 2, or 3, and b is 3, 4, 5, 6, 7, 8, or 9. Additive precursor formulae may also encompass precursors characterized by the formula $R_1R_2R_3XY$, where X may be any Group IV element, Y may be chlorine, bromine, or iodine, and $R_1$-$R_3$ may be in any combination, H, a methyl, ethyl, or other hydrocarbon, an additional halogen, or an additional Group IV element bonded with any other noted material extending the chain. For example, and without any limitation to the precursors encompassed by the above formulae, exemplary precursors may include silicon and chloride in any combination, such as carbon tetrachloride and/or disilicon hexachloride, and precursors may similarly include carbon and chloride, germanium and chloride, silicon and fluorine, carbon and fluorine, germanium and fluorine, silicon and bromine, carbon and bromine, germanium and bromine, silicon and iodine, carbon and iodine, germanium and iodine, selenium and fluorine, bromine, chlorine, or iodine, tellurium and fluorine, bromine, chlorine, or iodine, phosphorus and fluorine, bromine, chlorine, or iodine, and arsenic and fluorine, bromine, chlorine, or iodine. Additionally, the additive precursor may be characterized by one or more methyl groups, such as trimethyl silane.

The additive precursor may operate as a passivation precursor as discussed above. For example, while a fluorine-containing precursor may etch the materials, including silicon nitride as well as silicon oxide after sufficient exposure or without sufficient passivation, the additive precursor may perform the same passivation operation as noted above, without etching the structure. Because other halogen-containing precursors may perform similar functions as the fluorine-precursors noted above, the same operations may be performed, while further controlling the etch operations by limiting additional fluorine inclusion. While any precursor encompassed by the formulae noted above may be used as the additive precursor, in some embodiments precursors characterized by a silicon-silicon, carbon-carbon, germanium-germanium, or similar atomic bonding structure may be used, as the low-power plasma may more readily break this bond over the ancillary moieties of the precursor. The additive precursor may also facilitate healing of the etched surfaces. For example, the additive precursor may include silicon as noted above. Silicon-containing precursors, once plasma enhanced, may provide silicon back to the silicon oxide if etched. The added silicon may be oxidized when the structure is removed from the processing environment, where water within the atmosphere may react with silicon to resume an oxidized surface. Accordingly, the process may limit, prevent, or regenerate silicon oxide, which may maintain the silicon oxide layers during the etch process. In some embodiments where the additive precursor includes fluorine, the additive precursor may replace the fluorine-containing precursor.

Additional precursors may also be delivered with the fluorine-containing precursor in some embodiments of the present technology. For example, a hydrogen-containing precursor may be delivered, or one or more other precursors may be delivered, such as argon, nitrogen, helium, an oxygen-containing precursor, or other precursors. Hydrogen and argon may be readily ionizable relative to helium, which may facilitate processing in some embodiments. The hydrogen-containing precursor may be or include hydrogen, a hydrocarbon, or any hydrogen-containing precursor. Example oxygen-containing precursors may be or include water vapor, hydrogen peroxide, oxygen, ozone, nitrous oxide, nitric oxide, or an energized oxygen-containing material, although as previously explained in some embodiments the oxygen-containing precursor may not be plasma enhanced to limit interaction with the silicon nitride materials through the trench that are to be later etched. The present technology may additionally etch silicon, and providing an amount of an oxygen-containing precursor may facilitate the etching.

Without being bound to any particular theory, providing materials such as or including hydrogen or argon, among other precursors, may facilitate the etch process by providing additional electrons to the process. While fluorine may be a pseudo scavenger of electrons in plasma, the additional precursors may donate additional electrons, which may increase the electron density within the plasma, improving the etch process and selectivity to nitride. Accordingly, in some embodiments, a flow rate ratio of the fluorine-containing precursor to the additional precursor may be maintained. For example, a flow rate ratio of the additive and/or additional precursor, such as hydrogen or argon, may be maintained at least about 1:2 relative to the fluorine-containing precursor, and may be maintained at greater than or about 1:1, greater than or about 1.5:1, greater than or about 2.0:1, greater than or about 2.5:1, greater than or about 3.0:1, greater than or about 3.5:1, greater than or about 4.0:1, or higher. The flow rate ratio may be maintained however to limit dilution, which once high enough may inhibit additional etching, and thus in some embodiments the flow rate ratio of the additional precursor to the fluorine-containing precursor may be maintained at less than or about 10.0:1, less than or about 9.0:1, less than or about 8.0:1, less than or about 7.0:1, less than or about 6.0:1, less than or about 5.0:1, less than or about 4.0:1, less than or about 3.0:1, less than or about 2.0:1, less than or about 1.0:1, or lower. For example, the additional precursor may be included to facilitate plasma formation, such as argon, which may provide electrons. However, when the additive precursor is characterized by a lower ionization energy than argon, argon may be eliminated from the plasma precursors, which may increase selectivity.

In some embodiments, any one or more of the previously discussed precursors may be flowed directly to the processing region of the semiconductor processing chamber bypassing the remote plasma region. By bypassing the remote plasma region, plasma effluents of the precursors flowed directly to the processing region may not be formed. However, it is contemplated that plasma effluents may form due to contact with plasma effluents being generated in the remote plasma region and flowed to the processing region. For example, a second fluorine-containing precursor may bypass the remote plasma region and be flowed directly to the to the processing region. The second fluorine-containing precursor may be any of the fluorine-containing precursors previously mentioned and, in embodiments, may be or include atomic fluorine, diatomic fluorine, or a precursor characterized by the formula $X_aY_b$, where X includes any Group III, Group IV, Group V, or Group VI element, Y includes chlorine, bromine, or iodine, a is 1, 2, or 3, and b is 3, 4, 5, 6, 7, 8, or 9. For example, the second fluorine-containing precursor may be or include chlorine trifluoride, chlorine pentafluoride, bromine trifluoride, bromine pentafluoride, iodine trifluoride, iodine pentafluoride, iodine heptafluoride, and various other fluorine-containing precursors used or useful in semiconductor processing. Additionally, carrier gases or inert gases may also be flowed directly to the processing region of the semiconductor processing chamber bypassing the remote plasma region.

In bypassing the remote plasma region, the precursors provided directly to the processing may be flowed into the processing chamber separately from plasma effluents. By flowing precursors directly to the processing chamber, the presence of excited plasma effluents and unexcited precursors may be tuned within the processing region, which may allow etch rate and/or etch selectivity to be tuned. For example, by flowing additional fluorine-containing precursors to the processing region, additional fluorine radicals may be formed which may increase the etch rate and/or reduce etch selectivity. Conversely, by reducing or halting a flow of additional fluorine-containing precursors to the processing region, less fluorine radicals in the processing region may reduce the etch rate and/or increase the etch selectivity.

Process conditions may also impact the operations performed in method 400. Each of the operations of method 400 may be performed during a constant temperature in embodiments, while in some embodiments the temperature may be adjusted during different operations. Temperatures may be maintained in any range, however, at higher temperatures, further dissociation of the fluorine-containing materials may occur, which may produce more fluorine radicals. As the amount of fluorine radicals increases, oxide may begin to etch more readily, and the selectivity may be reduced. Accordingly, in some embodiments the temperature may be maintained below or about 700° C., and may be maintained below or about 650° C., below or about 600° C., below or about 550° C., below or about 500° C., or less. In some embodiments, the substrate, pedestal, or chamber temperature during the nitride or silicon etching may be maintained at a temperature less than or about 400° C., and in some embodiments the temperature may be maintained less than or about 350° C., less than or about 300° C., less than or about 250° C., less than or about 200° C., less than or about 150° C., less than or about 100° C., less than or about 50° C., less than or about 25° C., less than or about 10° C., less than or about 0° C., less than or about −10° C., less than or about −20° C., less than or about −30° C., less than or about −40° C., less than or about −50° C., less than or about −60° C., or lower.

As process temperatures lower, the selection of precursors may be augmented to reduced or limit free hydrogen. For example, while methyl groups may still beneficially passivate exposed oxide surfaces, as temperatures reduce below or about 20° C., free hydrogen may produce ammonia or fluorimide, which may etch oxide as well by producing ammonium fluorosilicate as a byproduct. Accordingly, in some embodiments, hydrogen concentration may be limited to less than 1:1 with any other element of a precursor, and, based on plasma power, may be limited to methyl groups that may perform passivation on exposed oxide surfaces during the nitride etch.

In some embodiments, the process may occur at a variety of pressures, which may facilitate operations in any of a number of process chambers. For example, the process may be performed within chambers capable of providing pressures below or about 10 mTorr, or lower, such as with a turbomolecular pump. Additionally, the pressure within the chamber may be maintained at higher pressures, which may increase the associated etch rate, and the pressure within the processing chamber may be maintained at greater than or about 1 Torr, and may be maintained at greater than or about 2 Torr, greater than or about 5 Torr, greater than or about 10 Torr, greater than or about 50 Torr, greater than or about 100 Torr, greater than or about 200 Torr, or higher.

Precursor and total flow rate may also facilitate improved silicon nitride etching. For example, argon, helium, nitrogen, or other plasma-stabilizing precursors may be delivered at or maintained at a flow rate of less than or about 100 sccm, and may be maintained at less than or about 90 sccm, less than or about 80 sccm, less than or about 70 sccm, less than or about 60 sccm, less than or about 50 sccm, less than or about 40 sccm, less than or about 30 sccm, less than or about 20 sccm, less than or about 10 sccm, or less. By lowering the flow of plasma-stabilizing precursors, dissociation may be reduced, lower plasma power may be used to produce plasma, and etching may be controlled to increase nitride etching, which may occur more readily relative to oxide etching. Flow of additive precursors, first halogen-containing precursors, second halogen-containing precursors, or total precursor flow may be maintained below or about any of the flow rates noted, which may further control dissociation and improve selectivity of nitride etching relative to oxide etching.

By performing an amount of etch followed by an amount of purge, a controlled lateral or isotropic etch of silicon nitride may be performed. To further facilitate etching, the present technology may be performed in a number of cycles to refresh the silicon oxide, allow the removal of etch byproducts, and facilitate delivery of etchants into the lateral recesses of the silicon nitride. In some embodiments the process, including the optional purge, may be performed in greater than or about 2, greater than or about 3, greater than or about 4, greater than or about 5, greater than or about 10 cycles, greater than or about 20 cycles, greater than or about 50 cycles, greater than or about 100 cycles, greater than or about 200 cycles, or more cycles, depending on factors such as the extent of silicon nitride etching to be performed, or other effects of the process.

A benefit of performing additional cycles may include that when hydrogen is incorporated with the etchant precursors, the hydrogen plasma effluents may beneficially interact with the silicon oxide layers of the stack to extract fluorine that may be interacting with the layers during each cycle. As previously discussed, silicon oxide may eventually react to the process for removing silicon nitride after an incubation period in which the fluorine may begin to interact with and extend into the oxide structure. However, although the hydrogen effluents may not react with the silicon oxide itself, or may only minimally interact, the effluent energy may be sufficient to withdraw fluorine that has begun to interact with the silicon oxide, and may remove the fluorine from the layers when the plasma effluents contact the exposed surfaces of the layers of silicon oxide. By performing a purge as described above, the removed fluorine and reacted hydrogen may be expelled from the chamber. This may, at least to an extent, refresh the incubation period, and may increase the overall selectivity of the silicon nitride etch process relative to silicon oxide by removing residual etchant from the silicon oxide with each cycle. By performing the processes as described above, an etch selectivity of silicon nitride relative to silicon oxide may be maintained at greater than or about 10:1, and may produce selectivity of greater than or about 15:1, greater than or about 20:1, greater than or about 30:1, greater than or about 50:1, greater than or about 70:1, greater than or about 100:1, or higher.

Figure 5A:
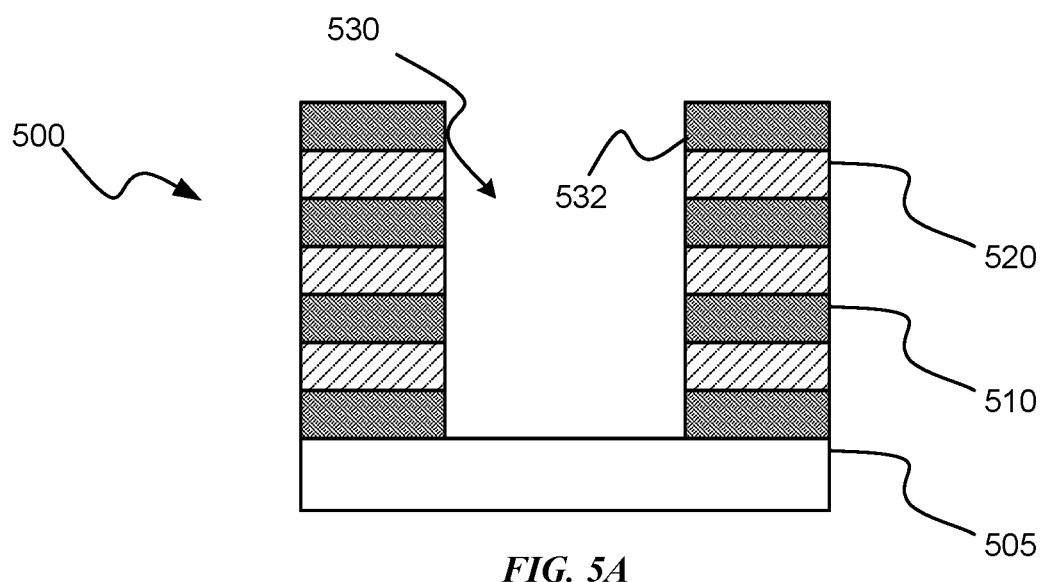
FIGS. 5A-5C show cross-sectional views of substrates being processed according to some embodiments of the present technology.
Figure 5B:
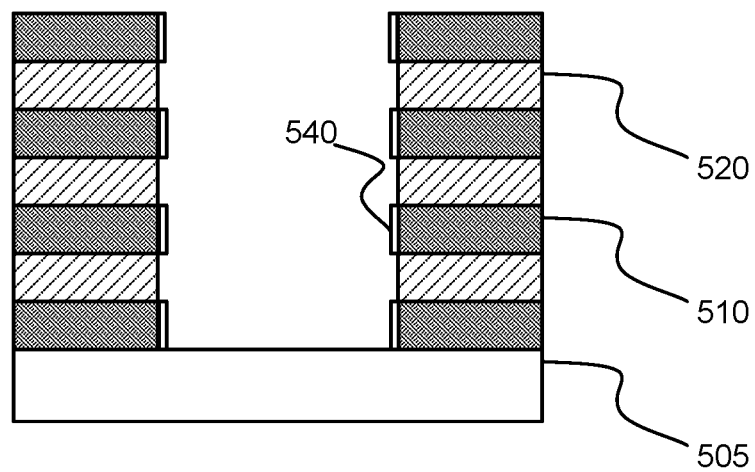
Figure 5C:
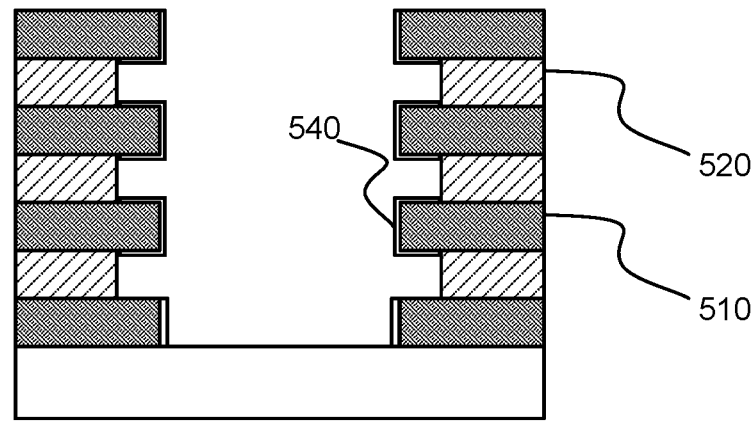

Turning to FIGS. 5A-5C are shown cross-sectional views of structure 500 being processed according to some embodiments of the present technology. As illustrated in FIG. 5A substrate 505 may have a plurality of stacked layers overlying the substrate, which may be silicon, silicon germanium, or other substrate materials. The layers may include IPD layers including dielectric material 510, which may be silicon oxide, in alternating layers with placeholder material 520, which may be silicon nitride. Placeholder material 520 may be or include material that will be removed to produce individual memory cells in subsequent operations. Although illustrated with only 7 layers of material, exemplary structures may include any of the numbers of layers previously discussed, and it is to be understood that the figures are only schematics to illustrate aspects of the present technology. Trench 530, which may be a memory hole, may be defined through the stacked structure to the level of substrate 505. Trench 530 may be defined by sidewalls 532 that may be composed of the alternating layers of dielectric material 510 and placeholder material 520.

In FIG. 5B is illustrated a structure after methods according to the present technology have begun to be performed, such as discussed with respect to FIG. 4 above. A remote plasma of a fluorine-containing precursor, which may include additional precursors, may be formed to produce plasma effluents. The plasma effluents may be delivered to the substrate processing region, where the effluents may interact with the substrate and exposed materials. As described above, while etching silicon nitride or placeholder material 520, the plasma effluents of some precursors according to embodiments of the present technology may passivate silicon oxide or create a protective layer 540 on exposed regions.

FIG. 5C illustrates a structure after further methods or operations according to the present technology have been performed, such as discussed with respect to FIG. 4 above. For example, as the etch process continues, additional passivation or protective material 540 may extend over further exposed surfaces of the dielectric material 510, which may continue to protect the material from vertical etching as the silicon nitride continues to be recessed during cycling of the process. By utilizing precursors and processing as discussed throughout the present technology, silicon nitride may be isotropically or laterally etched from between sections of silicon oxide, while limiting the damage or removal of silicon oxide.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of etching a silicon-containing material, the method comprising:
    flowing a first fluorine-containing precursor and an additive precursor into a remote plasma region of a semiconductor processing chamber, wherein the additive precursor comprises a halogen other than fluorine;
    flowing a sulfur-containing precursor into the remote plasma region of the semiconductor processing chamber;
    forming a plasma within the remote plasma region to generate plasma effluents of the first fluorine-containing precursor and the sulfur-containing precursor;
    flowing the plasma effluents into a processing region of the semiconductor processing chamber, wherein a substrate is positioned within the processing region, and wherein the substrate comprises a trench formed through stacked layers including alternating layers of silicon nitride and silicon oxide; and
    isotropically etching the layers of silicon nitride while substantially maintaining the silicon oxide.

2. The method of etching a silicon-containing material of claim 1, further comprising:
    flowing a second fluorine-containing precursor to the processing region of the semiconductor processing chamber, wherein the second fluorine-containing precursor bypasses the remote plasma region.

3. The method of etching a silicon-containing material of claim 1, further comprising:
    halting a flow of the first fluorine-containing precursor and the sulfur-containing precursor after a first period of time; and
    purging the processing region with a purge precursor.

4. The method of etching a silicon-containing material of claim 1, wherein the sulfur-containing precursor comprises hydrogen sulfide or carbon disulfide.

5. The method of treating a silicon-containing substrate of claim 1, wherein an etching selectivity between silicon nitride and silicon oxide is greater than or about 20:1.

6. The method of etching a silicon-containing material of claim 1, wherein the first fluorine-containing precursor comprises sulfur, phosphorus, arsenic, silicon, carbon, selenium, or tellurium.

7. The method of etching a silicon-containing material of claim 1, wherein the method is performed at a chamber operating pressure of between about 10 mTorr and about 5 Torr.

8. The method of etching a silicon-containing material of claim 1, wherein the method is performed at a chamber temperature of less than or about 20° C.

9. The method of etching a silicon-containing material of claim 1, further comprising:
    flowing argon, helium, or nitrogen with the first fluorine-containing precursor and the sulfur-containing precursor.

10. The method of etching a silicon-containing material of claim 9, wherein a flow rate ratio of the argon, helium, or nitrogen to the first fluorine-containing precursor is less than or about 2:1.

11. The method of etching a silicon-containing material of claim 1, further comprising:
    flowing a hydrogen-containing precursor with the first fluorine-containing precursor.

12. The method of treating a silicon-containing substrate of claim 1, further comprising:
    forming a passivation layer over the silicon oxide.

13. The method of etching a silicon-containing material of claim 1, wherein a flow rate ratio of the additive precursor relative to the first fluorine-containing precursor is maintained at greater than or about 1:2.

14. The method of etching a silicon-containing material of claim 13, wherein the flow rate ratio of the additive precursor to the first fluorine-containing precursor is maintained at less than or about 10:1.

15. A method of etching a silicon-containing material, the method comprising:
    flowing a first halogen-containing precursor into a remote plasma region of a semiconductor processing chamber, wherein the first halogen-containing precursor comprises fluorine;
    forming a plasma within the remote plasma region to generate plasma effluents of the first halogen-containing precursor;
    flowing the plasma effluents into a processing region of the semiconductor processing chamber, wherein a substrate is positioned within the processing region, and wherein the substrate comprises a trench formed through stacked layers including alternating layers of silicon nitride and silicon oxide;
    flowing a second halogen-containing precursor directly to the processing region of the semiconductor processing chamber, wherein the second halogen-containing precursor comprises chlorine, bromine, or iodine;
    laterally etching the layers of silicon nitride;
    halting a flow of the first halogen-containing precursor after a first period of time; and
    purging the processing region with a purge precursor.

16. The method of etching a silicon-containing material of claim 15, further comprising:
    flowing a sulfur-containing precursor into the remote plasma region of the semiconductor processing chamber.

17. The method of etching a silicon-containing material of claim 15, further comprising:
    repeating the method for at least 10 cycles.

18. The method of etching a silicon-containing material of claim 15, wherein the first period of time is greater than or about 30 seconds.

19. The method of etching a silicon-containing material of claim 15, further comprising:
flowing argon or nitrogen with the first halogen-containing precursor.

20. A method of etching a silicon-containing material, the method comprising:
flowing a first fluorine-containing precursor and an additive precursor into a remote plasma region of a semiconductor processing chamber, wherein the additive precursor comprises a halogen other than fluorine;
flowing a sulfur-containing precursor into the remote plasma region of the semiconductor processing chamber;
forming a plasma within the remote plasma region to generate plasma effluents of the first fluorine-containing precursor and the sulfur-containing precursor;
flowing the plasma effluents into a processing region of the semiconductor processing chamber, wherein a substrate is positioned within the processing region, and wherein the substrate defines a trench through stacked layers including alternating layers of silicon nitride and silicon oxide;
flowing a second fluorine-containing precursor to the processing region of the semiconductor processing chamber, wherein the second fluorine-containing precursor bypasses the remote plasma region; and
isotropically etching the layers of silicon nitride.

* * * * *